US012571849B2

(12) United States Patent
Kitagawa et al.

(10) Patent No.: US 12,571,849 B2
(45) Date of Patent: Mar. 10, 2026

(54) BATTERY MEASUREMENT DEVICE AND BATTERY MEASUREMENT METHOD

(71) Applicant: DENSO CORPORATION, Kariya-city (JP)

(72) Inventors: Masaaki Kitagawa, Kariya-city (JP); Isao Ishibe, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 73 days.

(21) Appl. No.: 18/397,239

(22) Filed: Dec. 27, 2023

(65) Prior Publication Data

US 2024/0125863 A1 Apr. 18, 2024

Related U.S. Application Data

(63) Continuation of application No. PCT/JP2022/022905, filed on Jun. 7, 2022.

(30) Foreign Application Priority Data

Jun. 29, 2021 (JP) ................................ 2021-107923

(51) Int. Cl.
*G01R 31/389* (2019.01)
*G01R 31/3842* (2019.01)

(52) U.S. Cl.
CPC ....... *G01R 31/389* (2019.01); *G01R 31/3842* (2019.01)

(58) Field of Classification Search
None
See application file for complete search history.

(56) References Cited

U.S. PATENT DOCUMENTS 5,677,081 A 10/1997 Iwamoto et al.
5,680,031 A 10/1997 Pavlovic et al.
(Continued)

FOREIGN PATENT DOCUMENTS

JP 2014-102127 A 6/2014
JP 2014-134467 A 7/2014
(Continued)

OTHER PUBLICATIONS

Aug. 2, 2022 Search Report issued in International Patent Application No. PCT/JP2022/022905.
(Continued)

*Primary Examiner* — Jas A Sanghera
(74) *Attorney, Agent, or Firm* — Oliff PLC

(57) ABSTRACT

A battery measurement device for measuring a state of a rechargeable battery, includes a signal control unit provided on a first electrical path connecting a positive electrode and a negative electrode of the rechargeable battery and configured to cause the rechargeable battery to output a predefined AC signal or to input a predefined AC signal to the rechargeable battery, a voltage measurement unit provided on a second electrical path connecting the positive electrode and the negative electrode of the rechargeable battery and configured to receive, via the second electrical path, voltage variations of the rechargeable battery in response to the AC signal, a calculation unit configured to calculate information on a complex impedance based on the voltage variations, and a determination unit configured to determine an abnormality and a precursory sign of an abnormality in the second electrical path based on the information on the complex impedance.

8 Claims, 8 Drawing Sheets

(56) References Cited

U.S. PATENT DOCUMENTS

| 6,037,778 A | 3/2000 | Makhija |
| 6,167,349 A | 12/2000 | Alvarez |
| 6,369,577 B1 | 4/2002 | Cho |
| 6,611,128 B2 | 8/2003 | Minamiura et al. |
| 6,759,832 B2 | 7/2004 | Minamiura et al. |
| 7,626,394 B2 | 12/2009 | Kimura et al. |
| 7,633,297 B2 | 12/2009 | Ishii |
| 7,675,293 B2 | 3/2010 | Christophersen et al. |
| 7,956,615 B1 | 6/2011 | Jaoude et al. |
| 7,977,919 B1 | 7/2011 | Jaoude et al. |
| 8,035,397 B1 | 10/2011 | Jaoude et al. |
| 8,129,996 B2 | 3/2012 | Iwane et al. |
| 8,332,342 B1 | 12/2012 | Saha et al. |
| 8,536,837 B1 | 9/2013 | Jaoude et al. |
| 8,704,489 B2 | 4/2014 | Hamaguchi et al. |
| 8,754,613 B2 | 6/2014 | Takahashi |
| 8,843,333 B2 | 9/2014 | Tezuka et al. |
| 9,069,046 B2 | 6/2015 | Morimoto et al. |
| 9,091,739 B2 | 7/2015 | Iwane et al. |
| 9,325,193 B2 | 4/2016 | Kelly |
| 9,465,077 B2 | 10/2016 | Love et al. |
| 9,618,584 B2 | 4/2017 | Kusano et al. |
| 9,791,519 B2 | 10/2017 | Kelly |
| 9,793,722 B2 | 10/2017 | Tamura et al. |
| 10,046,664 B2 | 8/2018 | Komiyama |
| 10,493,849 B2 | 12/2019 | Kanada et al. |
| 10,516,188 B2 | 12/2019 | Onoda |
| 10,534,038 B2 | 1/2020 | Tanaka et al. |
| 10,594,145 B1 | 3/2020 | Wang et al. |
| 10,775,444 B2 | 9/2020 | Tashiro |
| 10,807,494 B2 | 10/2020 | Yonemoto et al. |
| 10,976,373 B2 | 4/2021 | Ohkanda et al. |
| 11,002,795 B2 | 5/2021 | Choi et al. |
| 11,009,556 B2 | 5/2021 | Soejima et al. |
| 11,054,481 B2 | 7/2021 | Christophersen et al. |
| 11,193,983 B2 | 12/2021 | Soejima et al. |
| 11,340,277 B2 | 5/2022 | Yamamoto et al. |
| 11,397,215 B2 | 7/2022 | Ghantous et al. |
| 11,397,216 B2 | 7/2022 | Ghantous et al. |
| 11,422,198 B2 | 8/2022 | Shimonishi et al. |
| 11,428,745 B2 | 8/2022 | Haga et al. |
| 11,437,654 B2 | 9/2022 | Yamashima et al. |
| 11,467,218 B2 | 10/2022 | Ogasawara et al. |
| 11,585,862 B2 | 2/2023 | Shimonishi et al. |
| 11,614,493 B2 | 3/2023 | Mizuno et al. |
| 11,728,525 B2 | 8/2023 | Ghantous et al. |
| 11,835,588 B2 | 12/2023 | Kitagawa |
| 11,846,681 B2 | 12/2023 | Fukushima |
| 11,860,235 B2 | 1/2024 | Sano et al. |
| 11,971,456 B2 | 4/2024 | Christophersen et al. |
| 12,025,674 B2 | 7/2024 | Nagano et al. |
| 12,132,339 B2 | 10/2024 | Ghantous et al. |
| 12,136,708 B2 | 11/2024 | Ghantous et al. |
| 12,146,920 B2 | 11/2024 | Kim et al. |
| 12,176,497 B2 | 12/2024 | Ghantous et al. |
| 12,249,694 B2 | 3/2025 | Ghantous et al. |
| 12,265,134 B2 | 4/2025 | Nagano et al. |
| 12,385,981 B2 | 8/2025 | Kitagawa |
| 12,392,842 B2 | 8/2025 | Lee |
| 2003/0052646 A1 | 3/2003 | Minamiura et al. |
| 2003/0178970 A1 | 9/2003 | Minamiura et al. |
| 2007/0257681 A1 | 11/2007 | Christophersen et al. |
| 2008/0169819 A1 | 7/2008 | Ishii |
| 2008/0204031 A1 | 8/2008 | Iwane et al. |
| 2010/0045298 A1 | 2/2010 | Iwane et al. |
| 2010/0085015 A1 | 4/2010 | Hamaguchi et al. |
| 2011/0001352 A1 | 1/2011 | Tamura et al. |
| 2011/0018500 A1 | 1/2011 | Takahashi |
| 2012/0215472 A1 | 8/2012 | Tezuka et al. |
| 2012/0265462 A1 | 10/2012 | Iwane et al. |
| 2013/0141109 A1 | 6/2013 | Love et al. |
| 2013/0229156 A1 | 9/2013 | Brandon et al. |
| 2014/0091767 A1 | 4/2014 | Tamura et al. |
| 2014/0159736 A1 | 6/2014 | Morimoto et al. |
| 2015/0002101 A1 | 1/2015 | Hasegawa et al. |
| 2015/0002105 A1 | 1/2015 | Kelly |
| 2015/0160301 A1 | 6/2015 | Kusano et al. |
| 2015/0276889 A1 | 10/2015 | Osaka et al. |
| 2016/0238666 A1 | 8/2016 | Kelly |
| 2016/0375790 A1 | 12/2016 | Komiyama |
| 2017/0256822 A1 | 9/2017 | Onoda |
| 2018/0128881 A1 | 5/2018 | Kelly |
| 2018/0208062 A1 | 7/2018 | Kanada et al. |
| 2018/0321326 A1 | 11/2018 | Tanaka et al. |
| 2019/0023132 A1 | 1/2019 | Yonemoto et al. |
| 2019/0064282 A1 | 2/2019 | Haga et al. |
| 2019/0072618 A1 | 3/2019 | Ghantous et al. |
| 2019/0120910 A1 | 4/2019 | Ghantous et al. |
| 2019/0162796 A1 | 5/2019 | Soejima et al. |
| 2019/0170830 A1 | 6/2019 | Ohkanda et al. |
| 2019/0285702 A1 | 9/2019 | Tashiro |
| 2019/0293722 A1 | 9/2019 | Choi et al. |
| 2019/0361077 A1 | 11/2019 | Shimonishi et al. |
| 2020/0067145 A1 | 2/2020 | Yamashima et al. |
| 2020/0072909 A1 | 3/2020 | Soejima et al. |
| 2020/0191874 A1* | 6/2020 | Malrieu ................. G01R 31/58 |
| 2020/0300920 A1 | 9/2020 | Christophersen et al. |
| 2020/0371145 A1 | 11/2020 | Yamamoto et al. |
| 2020/0408844 A1 | 12/2020 | Ogasawara et al. |
| 2021/0018570 A1 | 1/2021 | Kitagawa |
| 2021/0148987 A1 | 5/2021 | Ghantous et al. |
| 2021/0255248 A1 | 8/2021 | Christophersen et al. |
| 2021/0270907 A1 | 9/2021 | Shimonishi et al. |
| 2022/0029443 A1 | 1/2022 | Konopka et al. |
| 2022/0045544 A1 | 2/2022 | Kitagawa |
| 2022/0065937 A1 | 3/2022 | Nagano et al. |
| 2022/0146583 A1 | 5/2022 | Kim et al. |
| 2022/0179010 A1 | 6/2022 | Fukushima |
| 2022/0196750 A1 | 6/2022 | Sano et al. |
| 2022/0317198 A1 | 10/2022 | Ghantous et al. |
| 2022/0317199 A1 | 10/2022 | Ghantous et al. |
| 2022/0320611 A1 | 10/2022 | Mizuno et al. |
| 2022/0373602 A1 | 11/2022 | Kitagawa et al. |
| 2023/0006271 A1 | 1/2023 | Ghantous et al. |
| 2023/0039183 A1 | 2/2023 | Ohkawa et al. |
| 2023/0090001 A1 | 3/2023 | Yamagami et al. |
| 2023/0324471 A1 | 10/2023 | Umemoto et al. |
| 2023/0335810 A1 | 10/2023 | Ghantous et al. |
| 2023/0393214 A1 | 12/2023 | Cha et al. |
| 2023/0417837 A1 | 12/2023 | Lee |
| 2024/0027534 A1 | 1/2024 | Hori et al. |
| 2024/0044827 A1 | 2/2024 | Ishigaki et al. |
| 2024/0094308 A1 | 3/2024 | Yoshida et al. |
| 2024/0125863 A1 | 4/2024 | Kitagawa et al. |
| 2024/0133960 A1 | 4/2024 | Kitagawa et al. |
| 2024/0133966 A1 | 4/2024 | Kitagawa et al. |
| 2024/0133967 A1 | 4/2024 | Kitagawa et al. |
| 2024/0168100 A1 | 5/2024 | Kitagawa et al. |
| 2024/0201272 A1 | 6/2024 | Nagano et al. |
| 2024/0230770 A9 | 7/2024 | Kitagawa et al. |
| 2024/0230776 A9 | 7/2024 | Kitagawa et al. |
| 2024/0230777 A9 | 7/2024 | Kitagawa et al. |
| 2024/0248146 A1 | 7/2024 | Christophersen et al. |
| 2024/0272235 A1 | 8/2024 | Shimonishi et al. |
| 2024/0283040 A1 | 8/2024 | Ghantous et al. |
| 2024/0304878 A1 | 9/2024 | Wampler et al. |
| 2024/0313274 A1 | 9/2024 | Ghantous et al. |
| 2024/0377458 A1 | 11/2024 | Munakata et al. |
| 2024/0385250 A1 | 11/2024 | Yoshida et al. |
| 2025/0020728 A1 | 1/2025 | Kitagawa et al. |
| 2025/0130285 A1 | 4/2025 | Yoshida et al. |
| 2025/0252175 A1 | 8/2025 | Takizawa et al. |

FOREIGN PATENT DOCUMENTS

| JP | 2018-190502 A | 11/2018 |
| JP | 2020034426 A | 3/2020 |

(56)                 References Cited

FOREIGN PATENT DOCUMENTS

| | | |
|---|---|---|
| JP | 2022003633 A | 1/2022 |
| WO | 2006022073 A1 | 3/2006 |

OTHER PUBLICATIONS

U.S. Appl. No. 18/074,566, filed Dec. 5, 2022 in the name of Yuji Yamagami et al.

\* cited by examiner

FIG.2

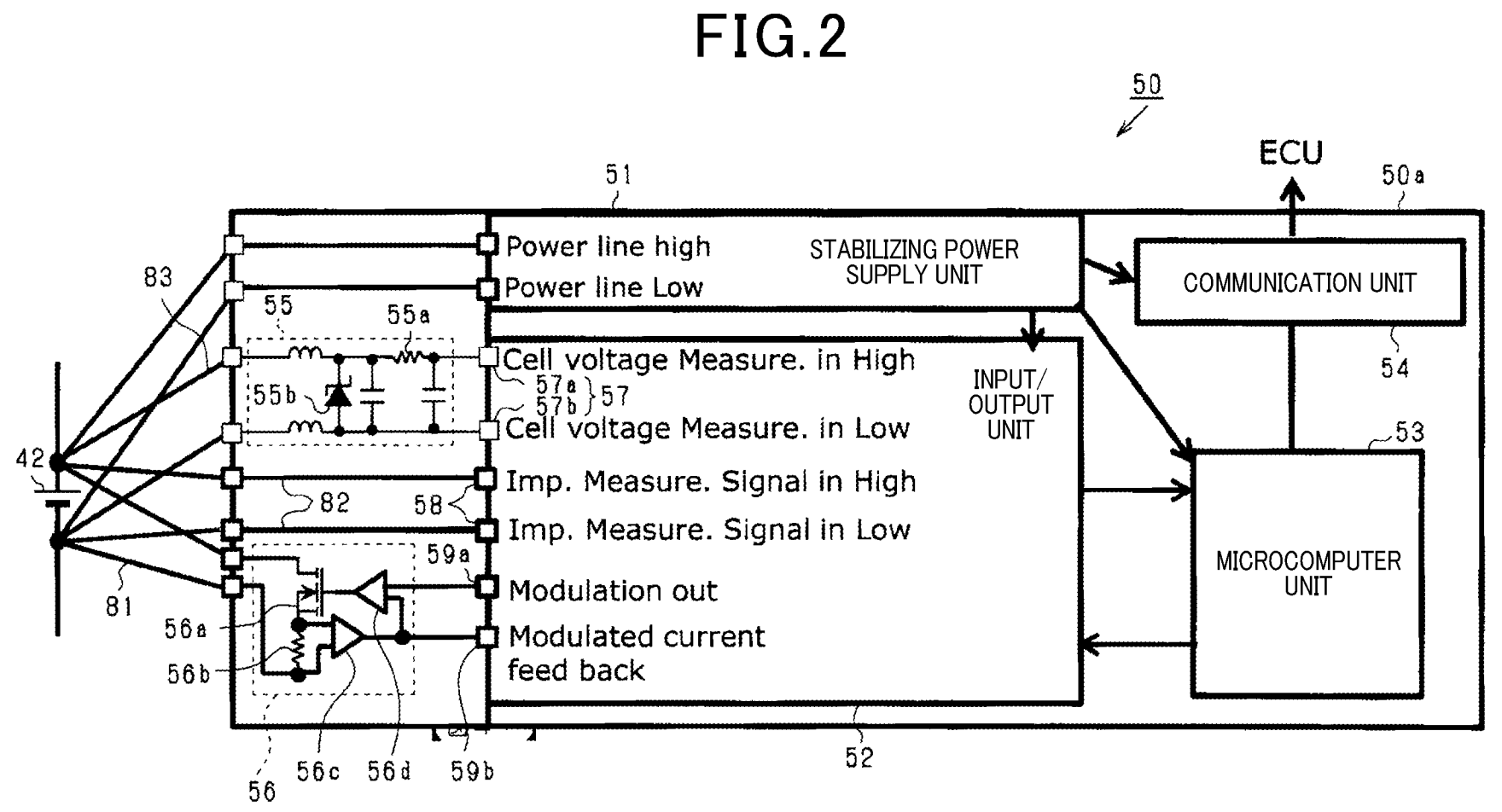

ECU

COMMUNICATION UNIT  54

50a

50

MICROCOMPUTER
UNIT  53

STABILIZING POWER
SUPPLY UNIT

INPUT/
OUTPUT
UNIT

51

52

Power line high

Power line Low

Cell voltage Measure. in High

Cell voltage Measure. in Low 57a
57b } 57

Imp. Measure. Signal in High

Imp. Measure. Signal in Low

Modulation out

Modulated current
feed back

55a

55

55b

58

82

59a

59b

56a

56b 56c  56d

56

83

81

42

BATTERY MEASUREMENT DEVICE AND BATTERY MEASUREMENT METHOD

CROSS-REFERENCE TO RELATED APPLICATION

This application is a continuation application of International Application No. PCT/JP2022/022905 filed Jun. 7, 2022 which designated the U.S. and claims priority to Japanese Patent Application No. 2021-107923 filed with the Japan Patent Office on Jun. 29, 2021, the contents of each of which are incorporated herein by reference.

BACKGROUND

Technical Field

This disclosure relates to a battery measurement device and a battery measurement method.

Related Art

Conventionally, a configuration for detecting an abnormality (e.g., defective connection) in detection lines (electrical paths) connecting circuitry that detects over-discharge and over-charge conditions of each battery cell and the battery cells has been known.

BRIEF DESCRIPTION OF THE DRAWINGS

In the accompanying drawings:

FIG. 2 is a block diagram of a battery measurement device;

DESCRIPTION OF SPECIFIC EMBODIMENTS

Figure 1:
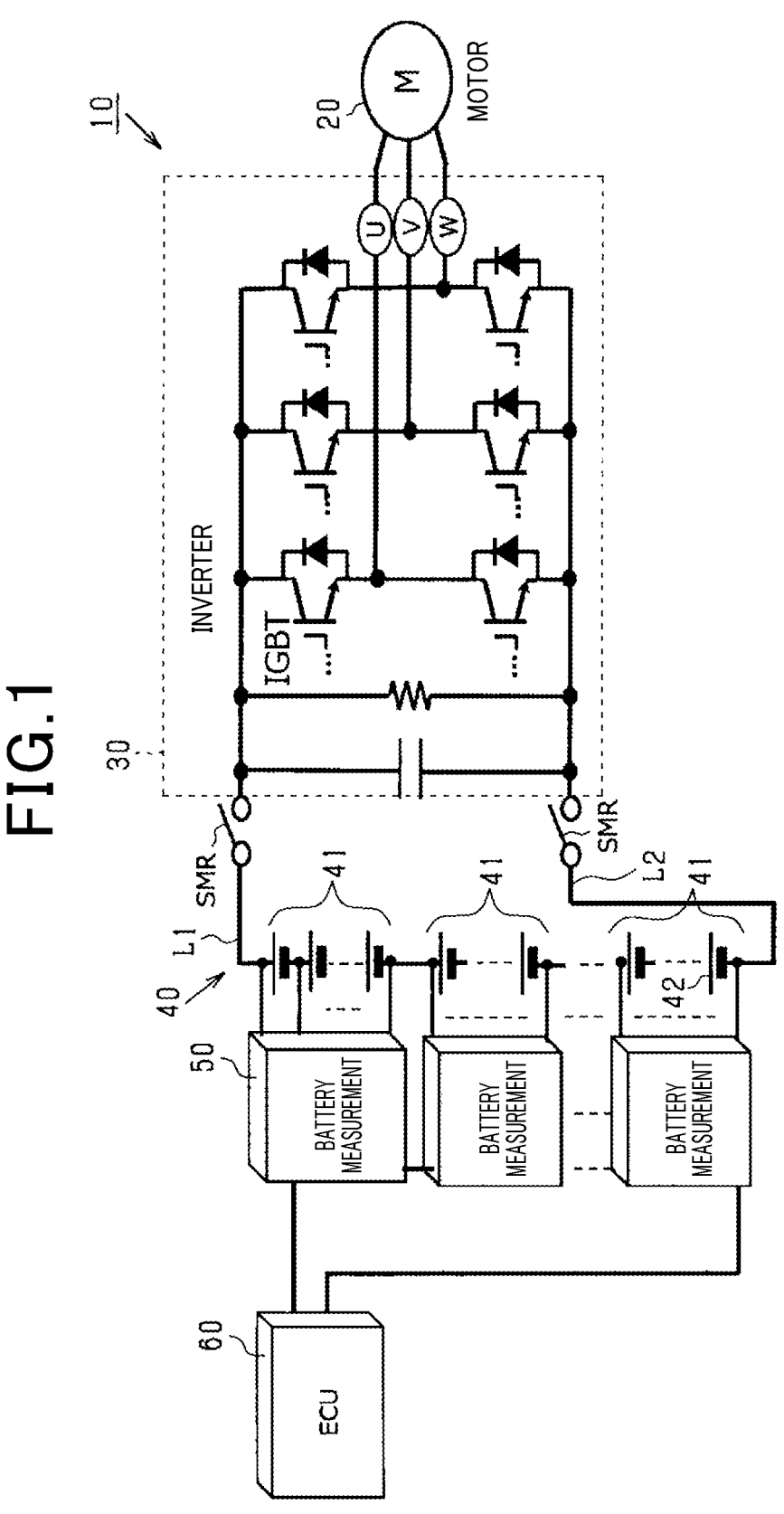
FIG. 1 is a schematic diagram of a power supply system.

In the known configuration as disclosed in JP 2014-102127 A, a determination as to whether an abnormality is occurring in the detection lines is made based on detected-voltage differences when short-circuit switches correspond-ing to adjacent battery cells are controlled to be turned on and off. This allows faults such as an increase in the wiring resistance of any of the detection lines and the like due to defective connections, as well as detection line disconnections, to be properly detected as detection line abnormalities.

Typically, the detection lines are wired on a circuit board, and the detection lines between a battery monitoring circuit and the battery cells are provided with harnesses and connectors for connecting the battery cells to the detection lines, as well as elements such as fuses, beads, and filter circuits. When the short-circuit switches are turned on and off, the magnitude of their resistances and the effect of the filter circuits may cause temporary voltage drops, which deteriorates the detection accuracy of the measured voltages. Thus, when the short-circuit switches are turned on and off, it is necessary to wait to measure the voltages until recovery of the voltages. Thus, there has been an issue that, when the voltages need to be measured frequently, it is not possible to allow enough time to turn the short-circuit switches on and off.

In view of the foregoing, it is desired to have a battery measurement device and a battery measurement method for detecting an abnormality and a precursory sign of an abnormality while suppressing deterioration of the measurement accuracy.

A battery measurement device for measuring a state of a rechargeable battery, provided to solve the above issue, includes: a signal control unit provided on a first electrical path connecting a positive electrode and a negative electrode of the rechargeable battery and configured to cause the rechargeable battery to output a predefined alternating current (AC) signal or to input a predefined AC signal to the rechargeable battery; a voltage measurement unit provided on a second electrical path connecting the positive electrode and the negative electrode of the rechargeable battery and configured to receive, via the second electrical path, voltage variations of the rechargeable battery in response to the AC signal; a calculation unit configured to calculate information on a complex impedance based on the voltage variations; and a determination unit configured to determine an abnormality and a precursory sign of an abnormality in the second electrical path based on the information on the complex impedance.

A battery measurement method provided to solve the above issue, which is performed by a battery measurement device for measuring a state of a rechargeable battery, includes: a signal control step of, by using a signal control unit provided on a first electrical path connecting a positive electrode and a negative electrode of the rechargeable battery, causing the rechargeable battery to output a predefined AC signal or inputting a predefined AC signal to the rechargeable battery; a voltage acquisition step of, by using a voltage measurement unit provided on a second electrical path connecting the positive electrode and the negative electrode of the rechargeable battery, acquiring, via the second electrical path, voltage variations of the rechargeable battery in response to the AC signal; a calculation step of calculating information on a complex impedance based on the voltage variations; and a determination step of determining an abnormality and a precursory sign of an abnormality in the second electrical path based on the information on the complex impedance.

Inputting to or outputting from the first electrical path an AC signal causes voltage variations of the rechargeable battery according to the AC signal, which allows information on the complex impedance to be calculated based on the voltage variations. This complex impedance not only reflects the internal state of the rechargeable battery, but also reflects the condition of the second electrical path. Therefore, from the information on the complex impedance, an abnormality in the second electrical path and a precursory sign of an abnormality can be determined.

In addition, when voltage variations are measured, only very small current flows through the second electrical path as compared to the current flowing through the first electrical path. That is, even if the current through the first electrical path is stopped, the resulting voltage variations are very small. Therefore, when measuring the voltage of the rechargeable battery by using the voltage measurement unit, a degree of voltage drop on the second electrical path is low even if the AC signal through the first electrical path is stopped. Therefore, even if the voltage is acquired at any given timing, deterioration of the voltage measurement accuracy can be suppressed. Or, the waiting time until the voltage becomes normal can be reduced.

First Embodiment

A first embodiment in which a "battery measurement device" is applied to a power supply system of a vehicle (e.g., a hybrid vehicle or an electric vehicle) will now be described with reference to the accompanying drawings.

As illustrated in FIG. 1, the power supply system 10 includes a motor 20 as a rotating electric machine, an inverter 30 as a power converter that applies 3-phase current to the motor 20, an assembled battery 40 that is chargeable and dischargeable, a battery measurement device 50 that measures the state of the assembled battery 40, and an ECU 60 that controls the motor 20 and other components.

The motor 20 is a vehicle prime mover and is capable of transmitting power to drive wheels (not shown). In the present embodiment, a 3-phase permanent magnet synchronous motor is used as the motor 20.

The inverter 30 is configured as a full bridge circuit that includes the same number of pairs of upper and lower arms as the number of phases of the phase windings, and the energizing current is controlled in each phase winding by turning on and off the switch (semiconductor switching element) provided to each arm.

The inverter 30 is equipped with an inverter control device (not shown). The inverter control device performs energization control by turning on and off each switch in the inverter 30 based on various items of detection information on the motor 20 and requests for power-running driving and power generation. This allows the inverter control device to supply power from the assembled battery 40 to the motor 20 via the inverter 30 to implement power-running driving of the motor 20. The inverter control device causes the motor 20 to generate power based on power from the drive wheels and converts the generated power and supplies it to the assembled battery 40 via the inverter 30 to charge the assembled battery 40.

The assembled battery 40 is electrically connected to the motor 20 via the inverter 30. The assembled battery 40 has an inter-terminal voltage of, for example, one hundred volts or more and has a plurality of battery modules 41 connected in series. The battery module 41 has a plurality of battery cells 42 connected in series. For example, a lithium-ion rechargeable battery or a nickel-metal hydride rechargeable battery may be used as the battery cell 42. Each battery cell 42 is a rechargeable battery that includes an electrolyte and a plurality of electrodes.

As illustrated in FIG. 1, the positive power source path L1, which is connected to the positive power source terminal of the assembled battery 40, is connected to the positive terminal of an electrical load such as the inverter 30. Similarly, the negative power source path L2, which is connected to the negative power source terminal of the assembled battery 40, is connected to the negative terminal of an electrical load such as the inverter 30. The positive power source path L1 and the negative power source path L2 are each provided with a relay switch SMR (system main relay switch), and the relay switch SMR is configured to turn on and off electrical conduction.

The battery measurement device 50 is configured to measure the state of charge (SOC) and the state of degradation (SOH) of each battery cell 42. The battery measurement device 50 is connected to the ECU 60 and outputs the state of each battery cell 42. The configuration of the battery measurement device 50 will be described later.

The ECU 60 provides requests for power-running driving and power generation to the inverter control device based on various items of information. The various items of information include, for example, accelerator and brake operation information, the vehicle speed, and the state of the assembled battery 40.

The battery measurement device 50 will now be described in detail. As illustrated in FIG. 2, in the first embodiment, the battery measurement device 50 is provided to measure and monitor the state of each battery cell 42.

The battery measurement device 50 includes an ASIC unit 50*a*, a filter unit 55, and a current modulation circuitry 56. The ASIC unit 50*a* includes a stabilizing power supply unit 51, an input/output unit 52, a microcomputer unit 53 as a calculation unit, and a communication unit 54.

The stabilizing power supply unit 51 is connected to the power supply line of the battery cell 42 and supplies power from the battery cell 42 to the input/output unit 52, the microcomputer unit 53, and the communication unit 54. The input/output unit 52, the microcomputer unit 53, and the communication unit 54 are driven based on this power.

The input/output unit 52 is connected to the battery cell 42 subject to measurement. Specifically, the input/output unit 52 includes direct current (DC) voltage input terminals 57 that can receive (measure) the DC voltage from the battery cell 42. The DC voltage input terminals 57 are connected to the battery cells 42 via third electrical path 83 for voltage detection. The third electrical path 83 between the battery cell 42 and the DC voltage input terminals 57 is provided with the filter unit 55. That is, an RC filter 55*a* as a filter circuit and a Zener diode 55*b* as a protection element are provided between the positive terminal 57*a* and the negative terminal 57*b* of the DC voltage input terminal 57. That is, the RC filter 55*a* and the Zener diode 55*b* are connected in parallel with the battery cell 42.

Figure 3:
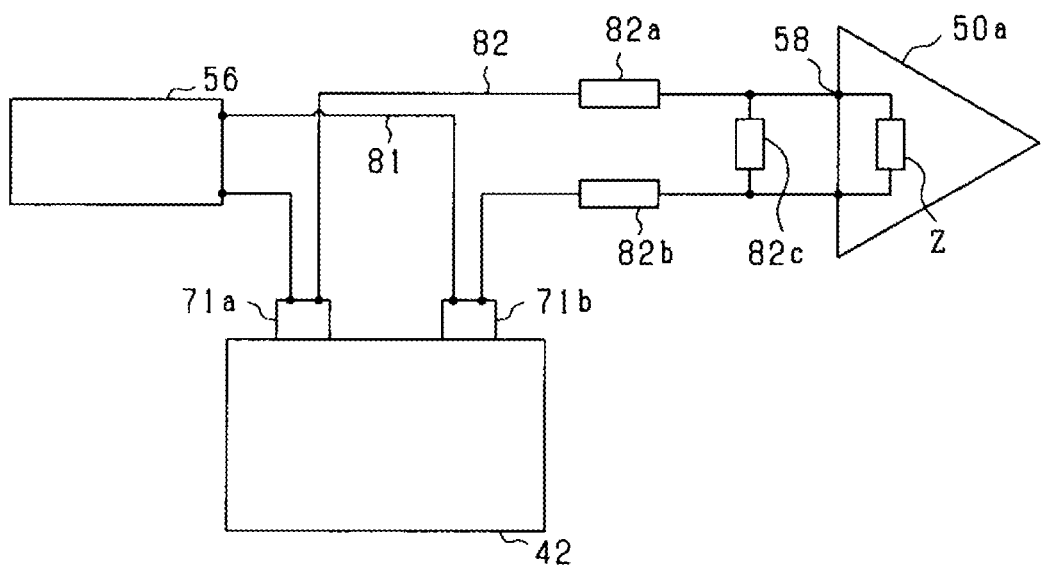
FIG. 3 is a schematic diagram of a connection state between the battery measurement device and a battery cell.

The input/output unit 52 includes response signal input terminals 58 for receiving a response signal (voltage variation) reflecting the internal complex impedance information of the battery cell 42 at the terminals of the battery cell 42. As illustrated in FIG. 3, the response signal input terminals 58 are connected to the battery cell 42 via the second electrical path 82. That is, the positive terminal of the response signal input terminals 58 is connected to the positive terminal 71*a* of the battery cell 42 via the second electrical path 82, and the negative terminal of the response signal input terminals 58 is connected to the negative terminal 71*b* of the battery cell 42 via the second electrical path 82. Although, in the present embodiment, the second electrical path 82 and the third electrical path 83 are provided independently, they may be shared in part or in whole. As described above, the input/output unit 52 functions as a voltage measurement unit.

The positive power source terminal 71*a* and the negative power source terminal 71*b* of the battery cell 42 are connected to respective electrodes (positive or negative electrode). Preferably, the response signal input terminals 58 are connected to connectable portions of the positive power source terminal 71*a* and the negative power source terminal 71*b* that are closest to the respective electrodes. Preferably, the DC voltage input terminals 57 are also connected to the connectable portions of the positive power source terminal 71*a* and the negative power source terminal 71*b* that are closest to the respective electrodes, or to the connectable portions that are second-closest to the respective electrodes next to the portions to which the response signal input terminals 58 are connected. This can minimize the effect of voltage drops caused by the main or equalizing current.

The input/output unit 52 is connected to the current modulation circuit 56 as a signal control unit and has an instruction signal output terminal 59*a* for outputting an instruction signal instructing the current modulation circuit 56 to cause the battery cell 42 to output a sinusoidal signal (AC signal). The input/output unit 52 has a feedback signal input terminal 59*b*. The feedback signal input terminal 59*b* receives the AC current actually output from the battery cell 42 (flowing through the first electrical path 81) via the current modulation circuit 56 as a feedback signal (measured AC current, i.e., a measured value).

The input/output unit 52 is connected to the microcomputer 53 and is configured to output the DC voltage received via the DC voltage input terminals 57, the response signal received via the response signal input terminals 58, and the feedback signal received via the feedback signal input terminal 59*b* to the microcomputer 53. The input/output unit 52 includes an AD converter and is configured to convert a received analog signal into a digital signal and output the digital signal to the microcomputer unit 53.

The input/output unit 52 is configured to receive an instruction signal from the microcomputer unit 53, and is configured to output the instruction signal to the current modulation circuit 56 via the instruction signal output terminal 59*a*. The input/output unit 52 includes a DA converter and is configured to convert a digital signal input from the microcomputer unit 53 into an analog signal and to output the instruction signal to the current modulation circuit 56. The AC signal (sinusoidal wave signal) that the current modulation circuit 56 is instructed by the instruction signal to output is DC biased so that the sine wave signal does not become negative current (reverse current to the battery cell 42).

The current modulation circuit 56 is a circuit that causes the battery cell 42 as the power source subject to measurement to output a predefined AC signal (sine wave signal). The current modulation circuit 56 is disposed on the first electrical path 81 connecting the positive power source terminal 71*a* and the negative power source terminal 71*b* of the battery cell 42, as illustrated in FIG. 3. In the present embodiment, the first electrical path 81 and the second electrical path 82 are provided independently.

Specifically, referring to FIG. 2, the current modulation circuit 56 includes a semiconductor switching element 56*a* (e.g., MOSFET) as a switch and a resistor 56*b* as a shunt resistor connected in series with the semiconductor switching element 56*a*. The drain terminal of the semiconductor switching element 56*a* is connected to the positive power source terminal 71*a* of the battery cell 42 via the first electrical path 81, and the source terminal of the semiconductor switching element 56*a* is connected in series with one end of the resistor 56*b*. The other end of the resistor 56*b* is connected to the negative power source terminal 71*b* of the battery cell 42 via the first electrical path 81. The semiconductor switching element 56*a* is configured to adjust the amount of current flow between the drain terminal and the source terminal. A resistor may be inserted in series in the current modulation circuit to adjust the voltage applied to the semiconductor switching element 56*a* according to the operating region of the semiconductor switching element 56*a*.

The current modulation circuit 56 includes a current detection amplifier 56*c* as a current measurement unit connected between both ends of the resistor 56*b*. The current detection amplifier 56*c* detects the alternating current flowing through the resistor 56*b* (i.e., the alternating current flowing through the first electrical path 81) and outputs a detection result as a feedback signal to the feedback signal input terminal 59*b* of the input/output unit 52.

The current modulation circuit 56 is equipped with a feedback circuit 56*d*. The feedback circuit 56*d* is configured to receive an instruction signal from the instruction signal output terminal 59*a* of the input/output unit 52 and a feedback signal from the current detection amplifier 56*c*. The feedback circuit 56*d* is configured to compare the instruction signal with the feedback signal and output a result of comparison to the gate terminal of the semiconductor switching element 56*a*.

Based on the signal from the feedback circuit 56*d*, the semiconductor switching element 56*a* adjusts the voltage applied between the gate and the source and adjusts the amount of current between the drain and the source so that the sinusoidal signal (predefined AC signal) indicated by the instruction signal is output from the battery cell 42. If there is an error between the waveform indicated by the instruction signal and the waveform that actually flows through the resistor 56*b*, the semiconductor switching element 56*a* adjusts the amount of current so that the error is corrected based on the signal from the feedback circuit 56*d*. This stabilizes the AC signal (sinusoidal signal) flowing through the resistor 56*b*.

Figure 4:
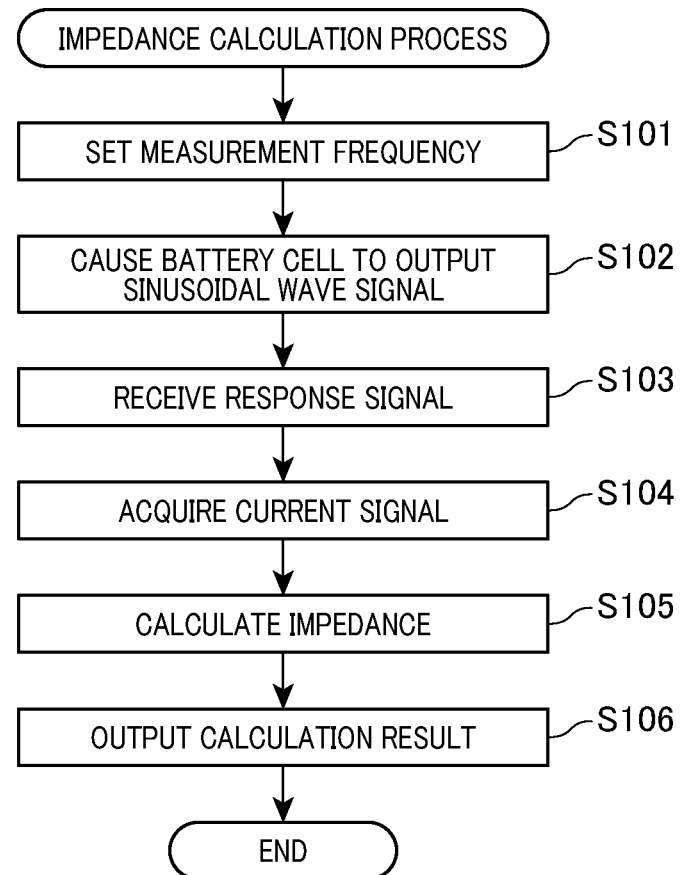
FIG. 4 is a flowchart of an impedance calculation process.

Next, a method of calculating the complex impedance of the battery cell 42 will now be described. The battery measurement device 50 performs an impedance calculation process illustrated in FIG. 4 at predefined time intervals.

In the impedance calculation process, the microcomputer unit 53 first sets a measurement frequency for the complex impedance (at step S101). The measurement frequency is set to a frequency within a predefined measurement range.

Next, the microcomputer unit 53 determines the frequency of the predefined AC signal (sinusoidal signal) based on the measurement frequency, and outputs an instruction signal instructing the input/output unit 52 to output the AC signal (at step S102). Step S102 corresponds to a signal control step.

Upon receiving the instruction signal, the input/output unit 52 uses the DA converter to convert the instruction signal into an analog signal, and outputs the analog signal to the current modulation circuit 56. The current modulation circuit 56 causes the battery cell 42 as a power source to output an AC signal based on the instruction signal. Specifically, the semiconductor switching element 56*a* adjusts the amount of current so that an AC signal indicated by the instruction signal is output from the battery cell 42 based on a signal input via the feedback circuit 56*d*. This allows the AC signal to be output from the battery cell 42.

When the AC signal is output from the battery cell 42, that is, when disturbances are imparted to the battery cell 42, voltage variations reflecting information on the complex impedance of the battery cell 42 occur between the terminals of the battery cell 42. The input/output unit 52 receives the voltage variations via the response signal input terminals 58 and outputs the voltage variations as a response signal to the microcomputer unit 53. At that time, the AD converter converts the response signal to a digital signal and outputs the digital signal.

After execution of step S102, the microcomputer unit 53 receives the response signal from the input/output unit 52 (at step S103). The microcomputer unit 53 also acquires the AC current flowing through the resistor 56b of the current modulation circuit 56 as a feedback signal (at step S104). Specifically, the microcomputer unit 53 receives the feedback signal output from the current detection amplifier 56c via the input/output unit 52. Instead of the feedback signal, a value proportional to the instruction signal output to the current modulation circuit 56 may be acquired. Step S103 corresponds to a voltage acquisition step.

Next, the microcomputer unit 53 calculates information on the complex impedance of the battery cell 42 based on the response signal and the feedback signal (measured AC current) (at step S105). In the present embodiment, the microcomputer unit 53 calculates the information on the complex impedance of the battery cell 42 by using the feedback signal as a reference signal and two phase lock-in detecting the response signal. That is, the microcomputer unit 53 calculates all or any of the real part, imaginary part, absolute value, and phase of the complex impedance based on the real part of the response signal, the imaginary part of the response signal, the real part of the current signal, and the imaginary part of the current signal, and the like. Step S105 corresponds to a calculation step. The microcomputer unit 53 outputs a calculation result to the ECU 60 via the communication unit 54 (at step S106). Then, the calculation process ends.

This calculation process is performed repeatedly until the complex impedance is calculated at a plurality of frequencies within the measurement range. Based on the calculation results, the ECU 60 creates, for example, a complex impedance plane plot (Cole-Cole plot) and acquires the characteristics of the electrodes and electrolyte. For example, the state of charge (SOC) and the state of health (SOH) are acquired.

It is not necessary to create the entire Cole-Cole plot, but rather, it is possible to focus on a portion of it. For example, the complex impedance at a certain frequency may be measured at fixed time intervals during driving, and changes in SOC, SOH, battery temperature and the like during driving may be acquired based on time variations of the complex impedance at this certain frequency. Alternatively, the complex impedance at a certain frequency may be measured at time intervals such as every day, every lap, or every year, and changes in SOH and the like may be acquired based on time variations of the complex impedance at the certain frequency.

The battery measurement device 50 is configured to determine an abnormality in the battery cell 42 based on the calculated complex impedance, as well as to determine an abnormality and a precursor sign of an abnormality in the second electrical path 82. The abnormality in the second electrical path 82 specifically refers to a disconnection (or line break) in the second electrical path 82. The disconnection means that the connection is completely lost and energization is disabled. More specifically, the disconnection refers to a state in which the conductor portion is divided in the middle of the electrical path and divided portions are connected only by an insulating film covering the conductor portion, or a state in which the path is completely disconnected in the middle of the electrical path and an insulating layer of air is formed. In equivalent circuit terms, the disconnection can be said to be a state in which a large resistance is disposed on the path, either by the insulating film or by the insulating layer of air.

Precursory signs of abnormalities in the second electrical path 82 include a defective connection and a defective wiring. In the following, they may be collectively referred to as defective connections. The defective connection or defective wiring is a state in which the electrical path is on the verge of a disconnection, although energization is enabled, and the resistance of the electrical path is increased or varying more than normal. That is, although not shown, there are elements (e.g., harnesses, connectors, etc.) between the battery cell 42 and the second electrical path 82 to connect wirings, and for some reason, connections by the elements may become disconnected (loose) and a defective connection may occur. Although not shown, there are elements (e.g., fuses or the like) to protect the circuits and elements (beads, filters) to remove noise on the second electrical path 82, and deterioration or failure of these elements may cause a defective wiring. The wiring may be near breaking on the second electrical path 82, resulting in a defective wiring.

A relationship between the complex impedance and the disconnection in the second electrical path 82 will now be described. When the second electrical path 82 is disconnected, it is difficult to measure voltage variations, and the complex impedance becomes unmeasurable or extremely small, allowing the disconnection to be determined.

Next, a relationship between the complex impedance and the defective connection in the second electrical path 82 will now be described. As illustrated in FIG. 3, the second electrical path 82 has wiring impedances 82a, 82b and an inter-wiring impedance 82c. The wiring impedances 82a and 82b are combined impedances based on various circuit elements disposed in the wirings and paths. The inter-wiring impedance 82c is likewise a combined impedance based on circuit elements and floating capacitances disposed between the paths.

Thus, when the voltage variation in the second electrical path 82 is measured by the input/output unit 52 and the complex impedance Z is calculated by the battery measurement device 50 based on the measured voltage variation, the calculated complex impedance Z is affected not only by the internal complex impedance of the battery cell 42, but also by the wiring impedances 82a, 82b and the inter-wiring impedance 82c. When a defective connection or the like occurs, the wiring resistance and the like in the second electrical path 82 commonly increases, and thus the wiring impedances 82a, 82b and the inter-wiring impedance 82c also change.

Figures 5A, 5B:
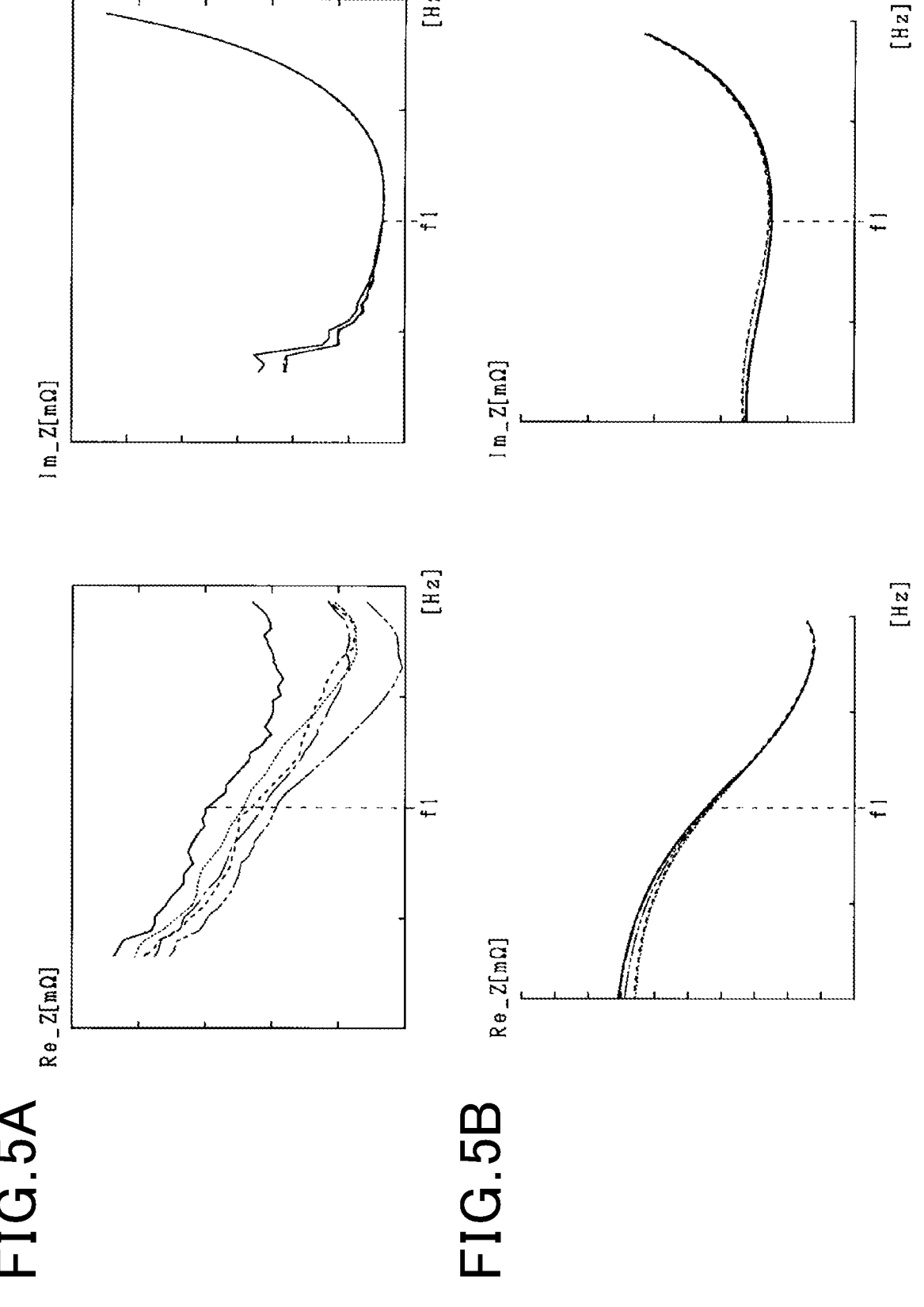
FIG. 5A is an illustration of real and imaginary parts of a complex impedance in the case of a defective connection occurring.
FIG. 5B is an illustration of real and imaginary parts of a complex impedance in the case of a good connection.

More specifically, FIG. 5A illustrates the real and imaginary parts (corresponding to the left and right portions, respectively) of the complex impedance calculated when a defective connection or the like has occurred. FIG. 5B illustrates the real and imaginary parts (corresponding to the left and right portions, respectively) of the complex impedance calculated when the connections and wirings are good. Each of FIGS. 5A and 5B illustrates multiple measurements under the same condition.

In each of FIGS. 5A and 5B, a comparison of the imaginary parts of the complex impedances (the right portions) shows that almost the same value is calculated for the measurement frequency higher than or equal to a predefined frequency f1, regardless of whether the connections or wirings are good or defective. On the other hand, a comparison of the real parts of the complex impedances (corresponding to the left portions) shows that almost the same value is calculated for the measurement frequency higher than or equal to the predefined frequency f1 when the connections are good (see FIG. 5B, but when the connections are defective, there are variations in the calculated value (see FIG. 5A. The reason for such variations in the real part of the calculated complex impedance when the connections or wirings are defective, despite being under the same condition, is considered to be that the resistive component of the path increases or varies due to a defective connection or the like.

The imaginary part of the complex impedance is a value relating to the capacitive component of the path. Even if the resistance component increases due to occurrence of a defective connection or the like, the effect on the capacitance component is small (the capacitance component does not vary much). Thus, even if a defective connection occurs, the imaginary part of the complex impedance measured by passing an AC signal through the path may almost likewise be measured as long as the current is flowing.

Figure 6:
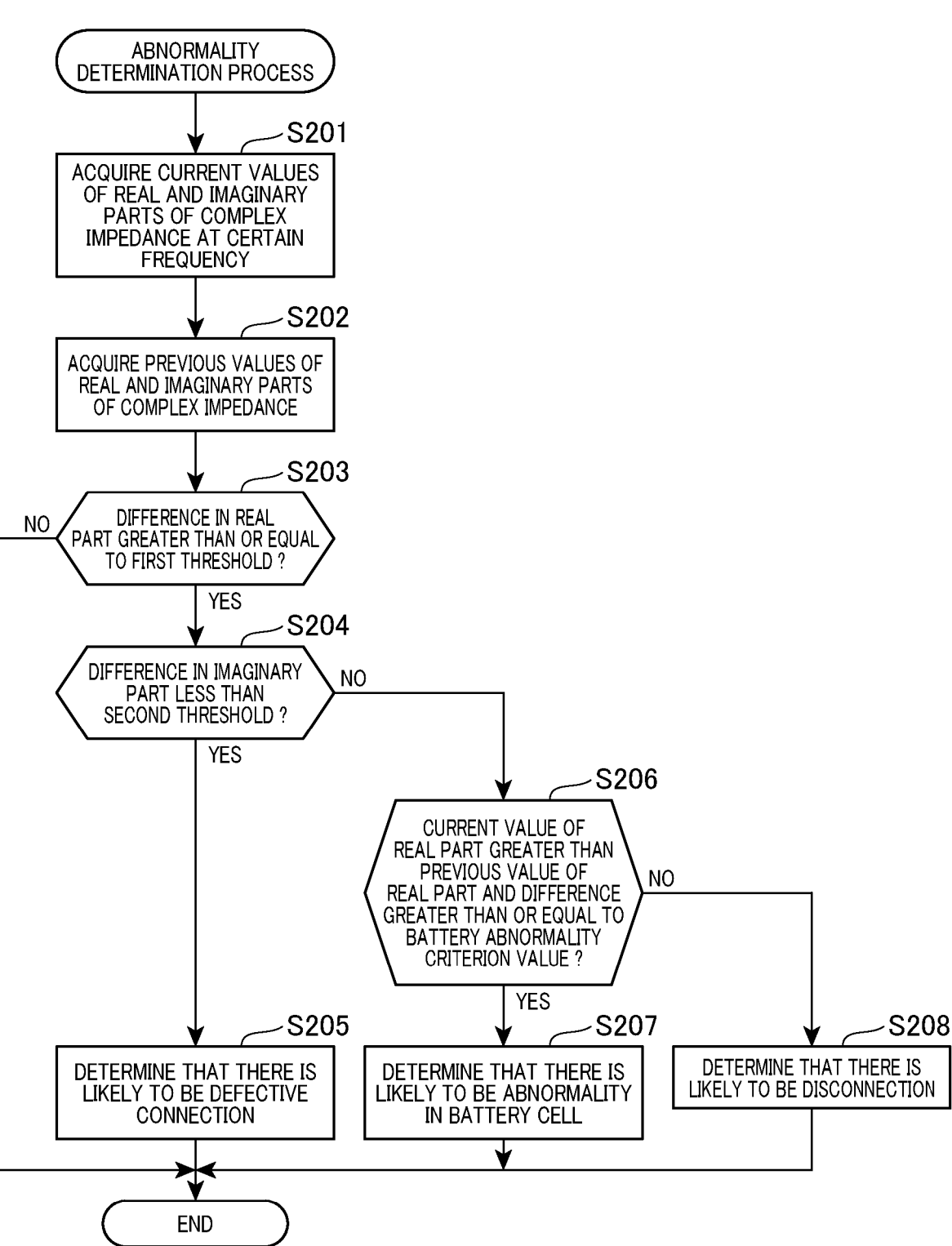
FIG. 6 is a flowchart of an abnormality determination process.

In the present embodiment, this principle is used to determine an abnormality and a precursory sign of an abnormality in the second electrical path 82, as described below. An abnormality determination process performed by the microcomputer unit 53 will now be described with reference to FIG. 6. The abnormality determination process is performed, for example, subsequent to the impedance calculation process.

The microcomputer unit 53 acquires the real and imaginary parts of the complex impedance at a certain frequency higher than or equal to the predefined frequency f1 from the complex impedances calculated this time or in the current cycle (step S201). Hereafter, each of the real and imaginary parts acquired at step S201 may be referred to as a current value.

Next, the microcomputer unit 53 acquires the real and imaginary parts of the complex impedance at the certain frequency from the complex impedances acquired the previous time or in the previous cycle (step S202). Hereafter, each of the real and imaginary parts acquired at step S202 may be referred to as a previous value. Preferably, the elapsed time from the time of the previous calculation to the time of the current calculation may be a short time such that the measurement condition including the state of the battery cell 42 (SOC, voltage, SOH, etc.) does not change. There is no problem even if the elapsed time is long, as long as the measurement condition is determined to be unchanged.

Next, the microcomputer unit 53 compares the real part of the complex impedance acquired this time and the real part of the complex impedance acquired the previous time and determines whether a difference between the current value and the previous value is greater than or equal to a first threshold (at step S203). If the answer is NO, the microcomputer unit 53 terminates the abnormality determination process. The first threshold is set to a value indicating that at least a defective connection or the like is occurring, and is set in advance by experimentation or the like.

On the other hand, if the answer is YES at step S203, the microcomputer unit 53 compares the imaginary part of the complex impedance acquired this time and the imaginary part of the complex impedance acquired the previous time and determines whether a difference between the current value and the previous value is less than a second threshold (at step S204). The second threshold is set to a value indicating that a disconnection or an abnormality in the battery cell 42 is occurring, and is set in advance by experimentation or the like. If the answer is YES, the microcomputer unit 53 determines that there is likely to be a defective connection or the like in the second electrical path 82 as a precursory sign of an abnormality in the second electrical path 82 (at step S205). Then, the microcomputer unit 53 notifies the ECU 60 and others that there is likely to be a defective connection or the like in the second electrical path 82, and terminates the abnormality determination process.

On the other hand, if the answer is NO at step S204 (if the difference is greater than or equal to the second threshold), the microcomputer unit 53 determines whether, for the real part of the complex impedance, the current value is greater than the previous value and the difference is greater than or equal to a battery abnormality criterion value that is greater than the first threshold (at step S206). If the answer is YES, the microcomputer unit 53 determines that there is likely to be an abnormality in the battery cell 42 (at step S207). Then, the microcomputer unit 53 notifies the ECU 60 and others that there is likely to be an abnormality in the battery cell 42, and terminates the abnormality determination process.

If the answer is NO at step S206, the microcomputer unit 53 determines that there is likely to be a disconnection in the second electrical path 82 (at step S208). For example, if, for the real part of the complex impedance, the current value is less than the previous value by the first threshold or more, the microcomputer unit 53 determines that there is likely to be a disconnection in the second electrical path 82. Then, the abnormality determination process is terminated.

As described above, the microcomputer unit 53 has a function as a determination unit by performing the abnormality determination process. Steps S201 to 208 of the abnormality determination process correspond to a determination step. The battery measurement method is implemented by the battery measurement device 50 performing the impedance calculation process and the abnormality determination process.

According to the above embodiment, the following advantages can be provided.

When an AC signal is output from the battery cell 42 via the first electrical path 81, the voltage of the battery cell 42 varies according to the AC signal. The battery measurement device 50 measures the voltage variations via the second electrical path 82 and calculates information on the complex impedance based on the measured voltage variations. This complex impedance not only reflects the internal state of the battery cell 42, but also reflects the condition of the second electrical path 82. Therefore, from the information on the complex impedance, the microcomputer unit 53 is capable of determining an abnormality in the second electrical path 82 and a precursory sign thereof.

Since the second and third electrical paths 82 and 83 are lines for detecting the voltage, only very small current flows through the second and third electrical paths 82 and 83 when voltage variations are measured, as compared to the current flowing through the first electrical path 81. That is, even if the current through the first electrical path 81 is stopped, the resulting voltage variations are very small. Therefore, when measuring the voltage of the battery cell 42 via the second or third electrical path 82, 83, a degree of voltage drop on each of the second and third electrical paths 82 and 83 is low even if the AC signal through the first electrical path 81 is stopped. Therefore, even if the voltage is acquired at any given timing, deterioration of the voltage measurement accuracy can be suppressed. Or, the waiting time until the voltage becomes normal can be reduced.

When a defective connection or the like occurs, the resistive component of the second electrical path 82 increases or varies. On the other hand, the capacitive component of the second electrical path 82 is unlikely to change even when a defective connection or the like occurs. Since the complex impedance is measured based on the voltage variations according to the AC signal, it is possible to measure the complex impedance even when a defective connection or the like occurs, as long as electrical conduction is allowed. Therefore, a defective connection, which is a precursory sign of an abnormality, can be determined based on the complex impedance.

Therefore, when the difference between the current value and the previous value of the real part of the complex impedance is greater than or equal to the first threshold and the difference between the current value and the previous value of the imaginary part of the complex impedance is less than the second threshold, the microcomputer unit 53 determines that there may be a defective connection or defective wiring in the second electrical path 82, which is a precursory sign of an abnormality. When the difference between the current value and the previous value of the real part of the complex impedance is greater than or equal to the first threshold and the difference between the current value and the previous value of the imaginary part of the complex impedance is greater than or equal to the second threshold, the microcomputer unit 53 determines that there may be an abnormality in the battery cell 42 or a disconnection in the second electric path 82 that is an abnormality in the second electric path 82. This allows a determination as to whether there is a defective connection in the second electrical path 82, a disconnection in the second electrical path 82 or an abnormality in the battery cell 42, to be made based on the complex impedance.

Basically, the real part of the complex impedance tends to increase as the battery cell 42 deteriorates. On the other hand, when the second electrical path 82 is disconnected, the real part of the complex impedance becomes extremely small. Therefore, when the difference between the current value and the previous value of the imaginary part of the complex impedance is greater than or equal to the second threshold, and the current value of the real part of the complex impedance is greater than the previous value of the real part of the complex impedance, and the difference between the current value and the previous value of the real part of the complex impedance is greater than the battery abnormality criterion value, the microcomputer unit 53 determines that there is likely to be an abnormality in the battery cell 42. This allows the disconnection in the second electrical path 82 and the abnormality in the battery cell 42 to be discriminated.

As illustrated in each of FIGS. 5A and 5B, when the measurement frequency is lower than the predefined frequency f1, variations in the real and imaginary parts of the complex impedance may occur even under the same condition, which may cause an erroneous determination. Thus, when the measurement frequency of the AC signal is higher than or equal to the predefined frequency f1, the microcomputer unit 53 determines an abnormality and a precursory sign of an abnormality in the second electrical path 82. This can suppress erroneous determinations.

Modifications (M1) In the above embodiment, the microcomputer unit 53 compares the current and previous values of the complex impedance. Alternatively, the microcomputer unit 53 may compare the current of the complex impedance with a past value other than the previous value, as long as the measurement condition is the same.

Figure 7A:
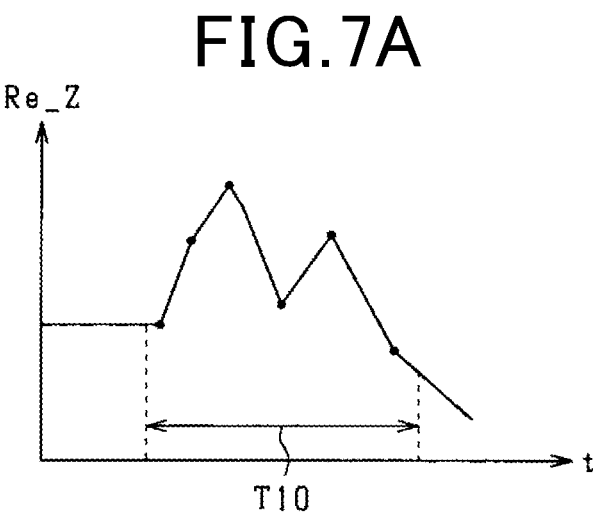
FIG. 7A is an illustration of a real part of a complex impedance in the case of a defective connection occurring.

(M2) In the above embodiment, the microcomputer unit 53 may determine an abnormality and a precursory sign of an abnormality by referring to the history of the complex impedance. Specifically, as illustrated in FIG. 7A, in cases where, despite a difference between the N-th and (N+1)-th measurements of the imaginary part of the complex impedance (N: any integer) being less than the second threshold within a predefined time period T10, it is repeatedly determined multiple times that a difference between the N-th and (N+1)-th measurements of the real part of the complex impedance is greater than or equal to the first threshold, the microcomputer unit 53 may determine that a defective connection or the like in the second electrical path 82 is occurring. The predefined time period may preferably be a short time such that the measurement condition, including the state of the battery cell 42 (SOC, voltage, SOH, etc.), do not change. There is no problem even if the predefined time period is long, as long as the measurement condition is determined to be unchanged.

Figure 7B:
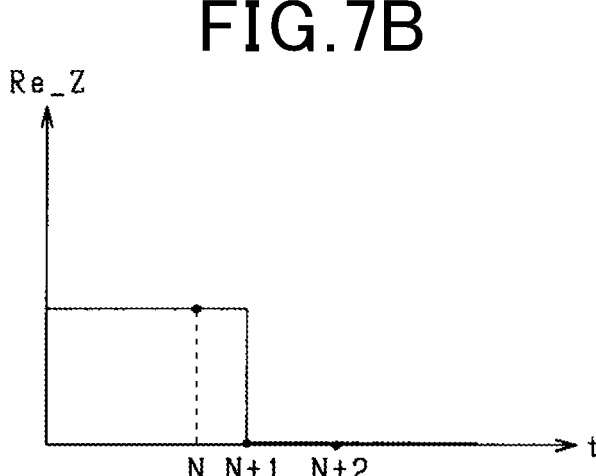
FIG. 7B is an illustration of a real part of a complex impedance in the case of a disconnection occurring.

As illustrated in FIG. 7B, the microcomputer unit 53 may determine that a disconnection in the second electrical path 82 is occurring when the difference between a value of the N-th or earlier measurement of the real part of the complex impedance and a value of the (N+1)-th or later measurement of the real part of the complex impedance continues to be greater than or equal to the first threshold.

Figure 7C:
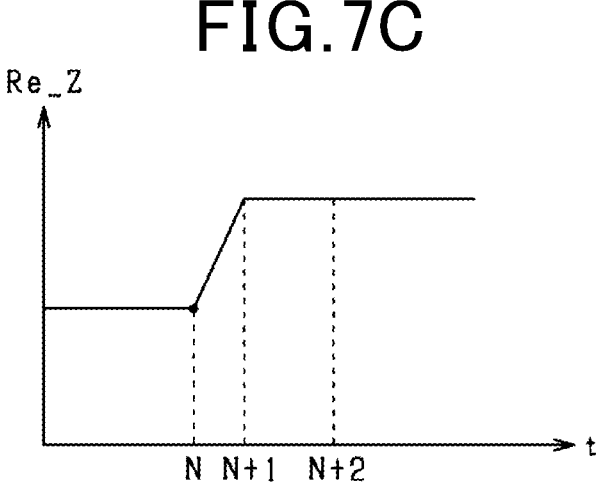
FIG. 7C is an illustration of a real part of a complex impedance in the case of an abnormality occurring in a battery cell.

As illustrated in FIG. 7C, the microcomputer unit 53 may determine that an abnormality in the battery cell 42 is occurring when a value of the (N+1)-th or later measurement of the real part of the complex impedance is greater than a value of the N-th or earlier measurement of the real part of the complex impedance and the difference between them continues to be greater than or equal to the battery abnormality criterion value.

(M3) In the above embodiment, the microcomputer unit 53 may determine that there is likely to be a disconnection in a case where the values of the real and imaginary parts of the complex impedance can not be measured. The case where the values of the real and imaginary parts of the complex impedance can not be measured refers, for example, to a situation where the real or imaginary part of the complex impedance, or both, remain stuck near the maximum (or minimum) value within the measurable frequency range where measurement is normally possible, or where either situation occurs alternately.

(M4) In the above embodiment, the microcomputer unit 53 may determine an abnormality (such as a disconnection) in the first electrical path 81 based on the feedback signal. Specifically, the microcomputer unit 53 may compare the feedback signal, which is a measurement result, with the indicated AC signal and determine that an abnormality is occurring in the first electrical path 81 if there is a difference greater than or equal to a predefined threshold or if the feedback signal can not be detected.

Figure 8:
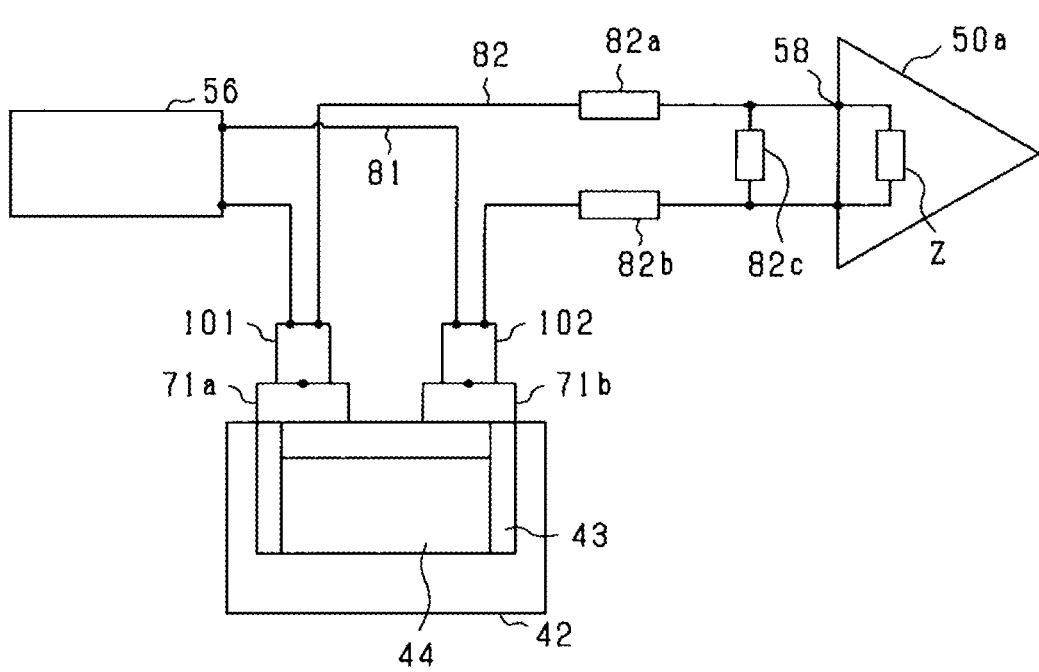
FIG. 8 is a schematic diagram of a connection state between the battery measurement device and a battery cell according to a modification.

(M5) In the above embodiment, as illustrated in FIG. 8, some wirings in the first electrical path 81 may be common to some wirings in the second electrical path 82. In FIG. 8, the common wirings are depicted as common wirings 101, 102. In this case, if a disconnection occurs in any of the common wirings 101 and 102, the value of the real part of the complex impedance becomes at least 10 times greater than before occurrence of the disconnection. When there is a precursory sign of disconnection, the value of the real part of the measured complex impedance becomes larger, or the variations in the real part of the measured impedance become larger as illustrated in FIG. 5A. When the value of the real part of the complex impedance becomes twice or more, it may be determined that a precursor is occurring. In the case of a precursory sign occurring, the variations in the imaginary part do not occur if the measurement frequency is higher than or equal to the pre-defined frequency f1, as illustrated in FIG. 5A.

Figure 9:
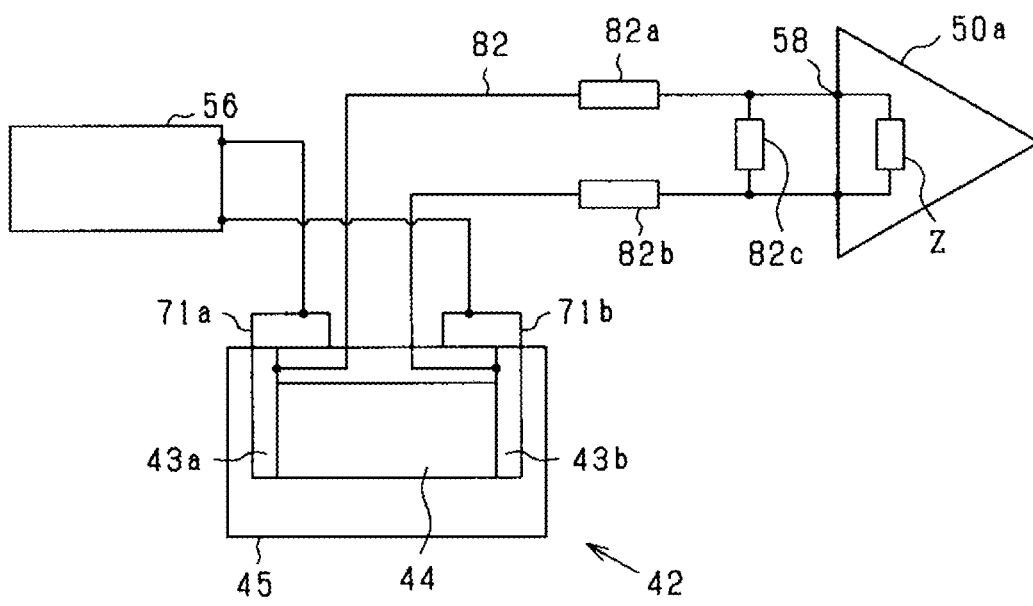
FIG. 9 is a schematic diagram of a connection state between the battery measurement device and a battery cell according to another modification.

(M6) In the above embodiment, as illustrated in FIG. 9, the second electrical path 82 may be directly connected to electrodes within the housing case. Specifically, the battery cell 42 may be equipped with an electrode body 44 that includes an electrolyte solution (electrolyte), a positive electrode 43a, a negative electrode 43b, and a separator disposed between the positive electrode 43a and the negative electrode 43b. The electrode body 44 is configured as a winding stack of the positive electrode 43a, the negative electrode 43b, and the separator. The positive electrode 43a and the negative electrode 43b are connected to the positive power source terminal 71a and the negative power source terminal 71b, respectively, and the positive power source terminal 71a and the negative power source terminal 71b protrude external of the housing case 45. Outside the housing case 45, the positive power source terminal 71a and the negative power source terminal 71b are connected to the first electrical path 81. On the other hand, the second electrical path 82 is wired to inside the housing case 45 and is connected to the positive electrode 43a and the negative electrode 43b inside the housing case 45. This can minimize the effects of voltage drops.

(M7) In the above embodiment, the AC signal is output from the battery cell 42. Alternatively, an AC signal (AC current or AC voltage) may be input from an external power source to the battery cell 42 to cause a disturbance. In this case, the AC signal may be input such that the amount of charge and the amount of discharge are equal so as to prevent the state of charge (SOC) or the like of the battery cell 42 from being changed by the input of the AC signal. The amount of charge and the amount of discharge may be adjusted by making a difference between the amount of charge and the amount of discharge so that the state of charge of the battery cell 42 becomes the desired value. In the case of the battery measurement device 50 for a vehicle, the external power source may be on-board or an external device outside the vehicle.

Figure 10:
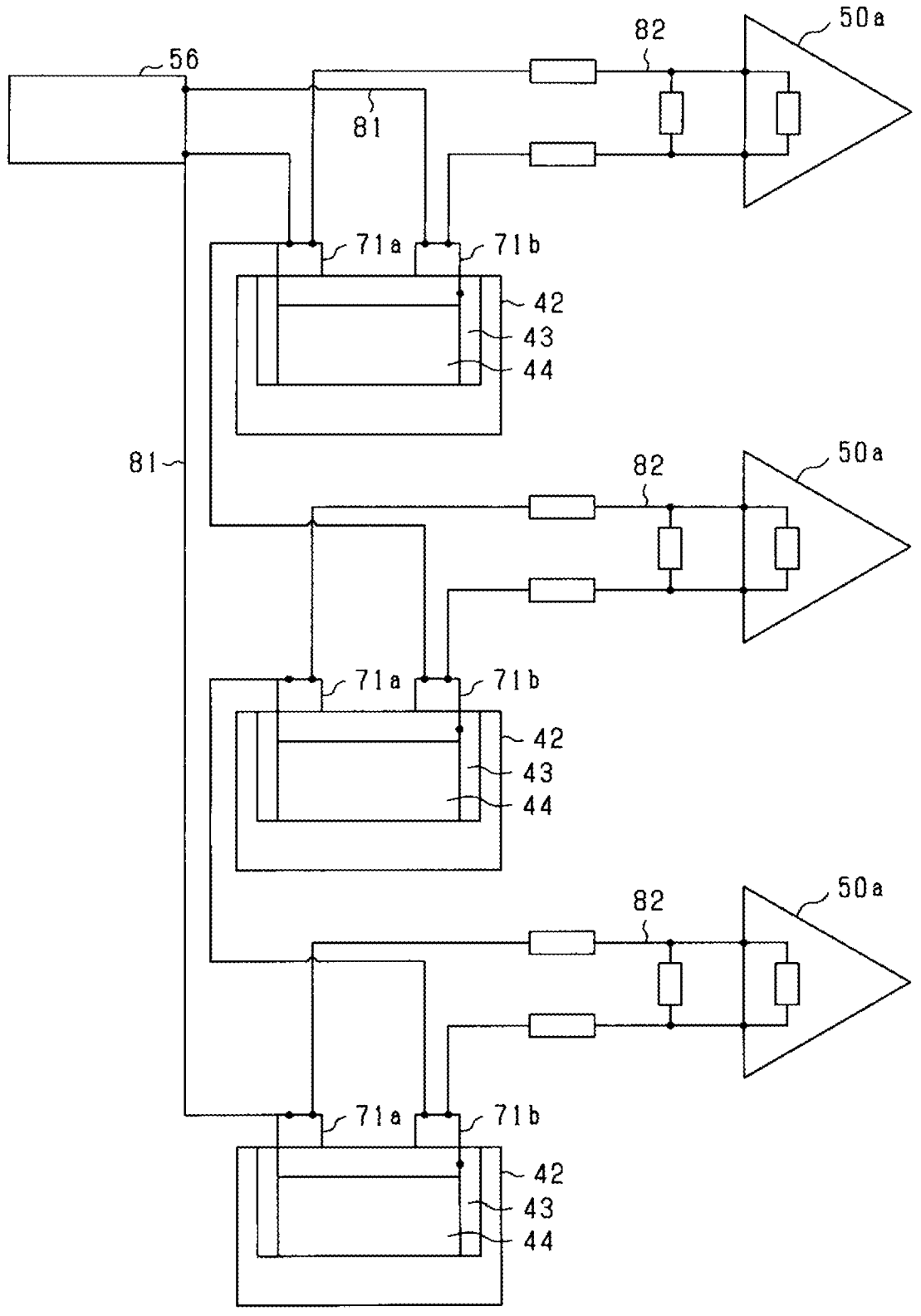
FIG. 10 is a schematic diagram of a connection state between the battery measurement device and battery cells according to another modification.

(M8) In the above embodiment, as illustrated in FIG. 10, an AC signal may be input to and output from a plurality of battery cells 42 connected in series.

(M9) In the above embodiment, the battery measurement device 50 may measure the state of a rechargeable battery other than the on-board assembled battery 40.

(M10) In the above embodiment, the battery measurement device 50 may be employed in HEVs, EVs, PHVs, accessory batteries, electric airplanes, electric motorcycles, and electric vessels as vehicles. In the above embodiment, the battery cells 42 may be connected in parallel with each other.

(M11) In the above embodiment, it is not necessary for the microcomputer unit 53 to calculate the complex impedance. Alternatively, information on the complex impedance may be calculated based on the response signal and current signal and output to an external device such as the ECU 60. The information on complex impedance refers, for example, to intermediate steps (e.g., only the real and imaginary parts of the current and voltage) necessary to calculate the absolute value of complex impedance, phase difference, and the like. The external device may then be allowed to calculate the final result, i.e., the absolute value and phase difference, and the like, of the complex impedance. The external device may then be allowed to determine an abnormality, or the like, in the second electrical pathway 82.

(M12) In the above embodiment, the method of analyzing the response signal (voltage variations) at each measurement frequency and measuring and calculating the amplitude, phase, and the like of the complex impedance may be any method. For example, the method is not limited to lock-in detection, but may utilize heterodyne detection, Fourier transform, and the like.

(M13) In the above embodiment, the feedback signal (detected signal) may be lock-in detected (two-phase detection) to extract the AC signal actually flowing through the battery cell 42, and information on the complex impedance may be acquired based on the measured AC signal and response signal (detected voltage variations).

(M14) In the above embodiment, the measured voltage variations and AC currents may be stored and sequentially analyzed for each measurement frequency based on the stored voltage variations and AC currents. That is, it is not necessary to analyze the voltage variations for a plurality of AC signals at the same time.

(M15) In the above embodiment, the AC signal is a sinusoidal signal. Alternatively, the AC signal may be changed arbitrarily. For example, the AC signal may be a square wave, a triangular wave, or the like.

The disclosure in this specification, the drawings, and the like is not limited to the illustrated embodiments. The disclosure encompasses the illustrated embodiments and variations thereof by those skilled in the art. For example, the present disclosure is not limited to the combinations of components and/or elements shown in the embodiments. The present disclosure may be implemented in various combinations. The present disclosure may have additional portions which may be added to the embodiments. The present disclosure encompasses omission of the components and/or elements of the embodiments. The present disclosure encompasses the replacement or combination of components and/or elements between one embodiment and another. The disclosed technical scope is not limited to the description of the embodiments. Several technical scopes disclosed are indicated by descriptions in the claims and should be understood to include all modifications within the meaning and scope equivalent to the descriptions in the claims.

The control device and the method thereof described in the present disclosure may be realized by a dedicated computer provided by configuring a processor and memory programmed to perform one or more functions embodied in a computer program. Alternatively, the control device and the method thereof described in the present disclosure may be realized by a dedicated computer provided by configuring a processor with one or more dedicated hardware logic circuits. Alternatively, the control device and the method thereof described in the present disclosure may be realized by one or more dedicated computers configured by a combination of a processor and memory programmed to perform one or more functions, and a processor configured with one or more hardware logic circuits. In addition, the computer program may be stored in a computer-readable, non-transitory tangible storage medium as instructions to be executed by a computer.

Although the present disclosure has been described in accordance with the above-described embodiments, it is not limited to such embodiments, but also encompasses various variations and variations within equal scope. In addition, various combinations and forms, as well as other combinations and forms, including only one element, more or less, thereof, are also within the scope and idea of the present disclosure.

What is claimed is:

1. A battery measurement device for measuring a state of a rechargeable battery, comprising:

a signal control unit provided on a first electrical path connecting a positive electrode and a negative electrode of the rechargeable battery and configured to cause the rechargeable battery to output a predefined AC signal or to input a predefined AC signal to the rechargeable battery;

a voltage measurement unit provided on a second electrical path connecting the positive electrode and the negative electrode of the rechargeable battery and configured to receive, via the second electrical path, voltage variations of the rechargeable battery in response to the AC signal;

a calculation unit configured to calculate information on a complex impedance based on the voltage variations; and a determination unit configured to determine an abnormality and a precursory sign of an abnormality in the second electrical path based on the information on the complex impedance, wherein the determination unit is configured to, when a difference between a current value and a previous value of a real part of the complex impedance is greater than or equal to a first threshold and also a difference between a current value and a previous value of an imaginary part of the complex impedance is less than a second threshold, determine that there is a defective connection or defective wiring in the second electrical path, and when the difference between the current value and the previous value of the real part of the complex impedance is greater than or equal to the first threshold and also the difference between the current value and the previous value of the imaginary part of the complex impedance is greater than or equal to the second threshold, determine that there is an abnormality in the rechargeable battery or a disconnection that is an abnormality in the second electric path.

2. The battery measurement device according to claim 1, wherein the determination unit is configured to, when the difference between the current value and the previous value of the imaginary part of the complex impedance is greater than or equal to the second threshold, the current value of the real part of the complex impedance is greater than the previous value of the real part of the complex impedance, and the difference between the current value and the previous value of the real part of the complex impedance is greater than or equal to a battery abnormality criterion value, the battery abnormality criterion value being greater than the first threshold, determine that there is an abnormality in the rechargeable battery.

3. The battery measurement device according to claim 1, wherein the determination unit is configured to, despite a difference between an N-th and (N+1)-th measurements of the imaginary part of the complex impedance being less than the second threshold within a predefined time period, it is repeatedly determined multiple times that a difference between an N-th and (N+1)-th measurements of the real part of the complex impedance is greater than or equal to the first threshold, determine that there is a defective connection or a defective wiring in the second electrical path.

4. The battery measurement device according to claim 1, wherein the determination unit is configured to, when a measurement frequency of the AC signal is higher than or equal to a predefined frequency, determine an abnormality and a precursory sign of an abnormality in the second electrical path.

5. The battery measurement device according to claim 1, further comprising:

a current measurement unit configured to measure the AC signal flowing through the first electrical path, wherein the calculation unit is configured to calculate information on the complex impedance based on measurements of the AC signal measured by the current measurement unit and the voltage variations, and the determination unit is configured to determine an abnormality in the first electrical path based on a comparison between the measurements of the AC signal measured by the current measurement unit and the AC signal to be input or output by the signal control unit.

6. A battery measurement device for measuring a state of a rechargeable battery, comprising:

a signal control unit provided on a first electrical path connecting a positive electrode and a negative electrode of the rechargeable battery and configured to cause the rechargeable battery to output a predefined AC signal or to input a predefined AC signal to the rechargeable battery;

a voltage measurement unit provided on a second electrical path connecting the positive electrode and the negative electrode of the rechargeable battery and configured to receive, via the second electrical path, voltage variations of the rechargeable battery in response to the AC signal;

a calculation unit configured to calculate information on a complex impedance based on the voltage variations;

a determination unit configured to determine an abnormality and a precursory sign of an abnormality in the second electrical path based on the information on the complex impedance, and a current measurement unit configured to measure the AC signal flowing through the first electrical path, wherein the calculation unit is configured to calculate information on the complex impedance based on measurements of the AC signal measured by the current measurement unit and the voltage variations, and the determination unit is configured to determine an abnormality in the first electrical path based on a comparison between the measurements of the AC signal measured by the current measurement unit and the AC signal to be input or output by the signal control unit.

7. A battery measurement method to be performed by a battery measurement device for measuring a state of a rechargeable battery, comprising:

a signal control step of, by using a signal control unit provided on a first electrical path connecting a positive electrode and a negative electrode of the rechargeable battery, causing the rechargeable battery to output a predefined AC signal or inputting a predefined AC signal to the rechargeable battery;

a voltage acquisition step of, by using a voltage measurement unit provided on a second electrical path connecting the positive electrode and the negative electrode of the rechargeable battery, acquiring, via the second electrical path, voltage variations of the rechargeable battery in response to the AC signal;

a calculation step of calculating information on a complex impedance based on the voltage variations; and a determination step of determining an abnormality and a precursory sign of an abnormality in the second electrical path based on the information on the complex impedance, wherein the determination step comprises, when a difference between a current value and a previous value of a real part of the complex impedance is greater than or equal to a first threshold and also a difference between a current value and a previous value of an imaginary part of the complex impedance is less than a second threshold, determining that there is a defective connection or defective wiring in the second electrical path, and the determination step further comprises, when the difference between the current value and the previous value of the real part of the complex impedance is greater than or equal to the first threshold and also the difference between the current value and the previous value of the imaginary part of the complex impedance is greater than or equal to the second threshold, determining that there is an abnormality in the rechargeable battery or a disconnection that is an abnormality in the second electric path.

8. A battery measurement method to be performed by a battery measurement device for measuring a state of a rechargeable battery, comprising:

a signal control step of, by using a signal control unit provided on a first electrical path connecting a positive electrode and a negative electrode of the rechargeable battery, causing the rechargeable battery to output a predefined AC signal or inputting a predefined AC signal to the rechargeable battery;

a voltage acquisition step of, by using a voltage measurement unit provided on a second electrical path connecting the positive electrode and the negative electrode of the rechargeable battery, acquiring, via the second electrical path, voltage variations of the rechargeable battery in response to the AC signal;

a calculation step of calculating information on a complex impedance based on the voltage variations;

a determination step of determining an abnormality and a precursory sign of an abnormality in the second electrical path based on the information on the complex impedance; and a current measurement step of measuring the AC signal flowing through the first electrical path, wherein the calculation step comprises calculating information on the complex impedance based on measurements of the AC signal measured in the current measurement step and the voltage variations, and the determination step comprises determining an abnormality in the first electrical path based on a comparison between the measurements of the AC signal measured in the current measurement step and the AC signal to be input or output in the signal control step.

* * * * *